United States Patent
Ye et al.

(10) Patent No.: US 6,607,634 B2
(45) Date of Patent: Aug. 19, 2003

(54) RETICLE ADAPTER FOR A REACTIVE ION ETCH SYSTEM

(75) Inventors: Yan Ye, Saratoga, CA (US); Richard W. Plavidal, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 239 days.

(21) Appl. No.: 09/866,883

(22) Filed: May 29, 2001

(65) Prior Publication Data

US 2001/0022216 A1 Sep. 20, 2001

Related U.S. Application Data

(62) Division of application No. 09/238,205, filed on Jan. 27, 1999, now Pat. No. 6,251,217.

(51) Int. Cl.[7] .................. H01L 21/3065; C23F 1/00; B05C 13/00
(52) U.S. Cl. .............. 156/345.51; 156/345.48
(58) Field of Search .................. 118/728, 500, 118/720, 721; 204/298.15; 156/345.51, 345.48

(56) References Cited

U.S. PATENT DOCUMENTS

| | | | | |
|---|---|---|---|---|
| 3,207,126 A | * | 9/1965 | Byron | 118/721 |
| 4,889,998 A | * | 12/1989 | Hayano et al. | 250/559.41 |
| 4,926,489 A | * | 5/1990 | Danielson et al. | 382/144 |
| 5,750,003 A | * | 5/1998 | Chun | 156/450 |
| 6,040,096 A | * | 3/2000 | Kakizaki et al. | 430/5 |
| 6,232,247 B1 | * | 5/2001 | Gordon et al. | 438/780 |
| 6,251,217 B1 | * | 6/2001 | Ye et al. | 156/345.51 |
| 6,530,994 B1 | * | 3/2003 | Mahawili | 118/725 |
| 2001/0022216 A1 | * | 9/2001 | Ye et al. | 156/345 |

FOREIGN PATENT DOCUMENTS

| EP | 1 024 520 A2 | * | 8/2000 |
|---|---|---|---|
| JP | 2000-286250 | * | 10/2000 |

OTHER PUBLICATIONS

Grenon, Brian J., "Mask Technology Challenges and 230–mm Reticles", Solid State Technology, Aug. 1998.

"Dry Etch Process Answers Demand for Tighter Tolerances", Imaging World, 1998.

* cited by examiner

*Primary Examiner*—Jeffrie R. Lund
(74) *Attorney, Agent, or Firm*—Moser Patterson & Sheridan

(57) ABSTRACT

A reticle adapter that is capable of supporting a reticle in a conventional reactive ion etch chamber that is designed for etching circular silicon wafers. The adapter has a lower portion that is milled to cover the upper portion of a pedestal within a reactive ion etch chamber. A top portion of the adapter has an opening that is sized and shaped to hold a reticle.

48 Claims, 3 Drawing Sheets

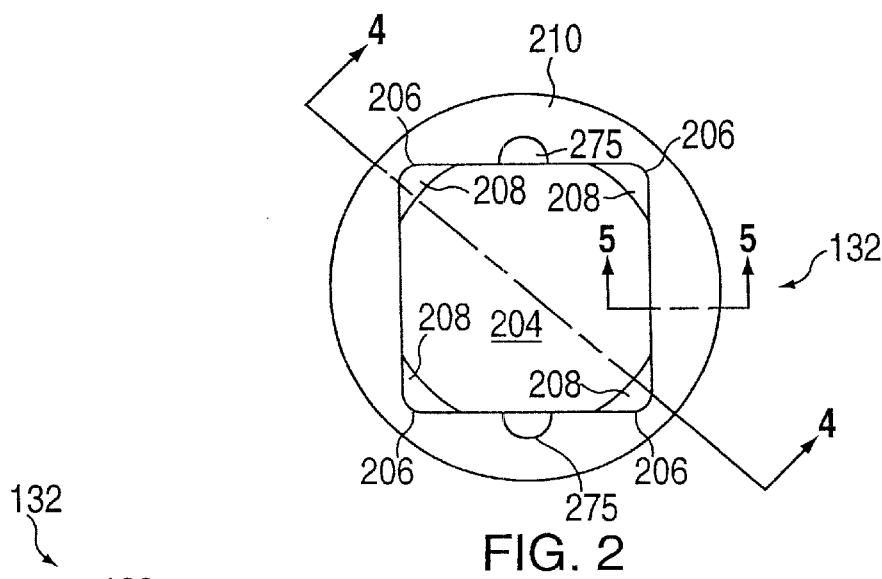
FIG. 2
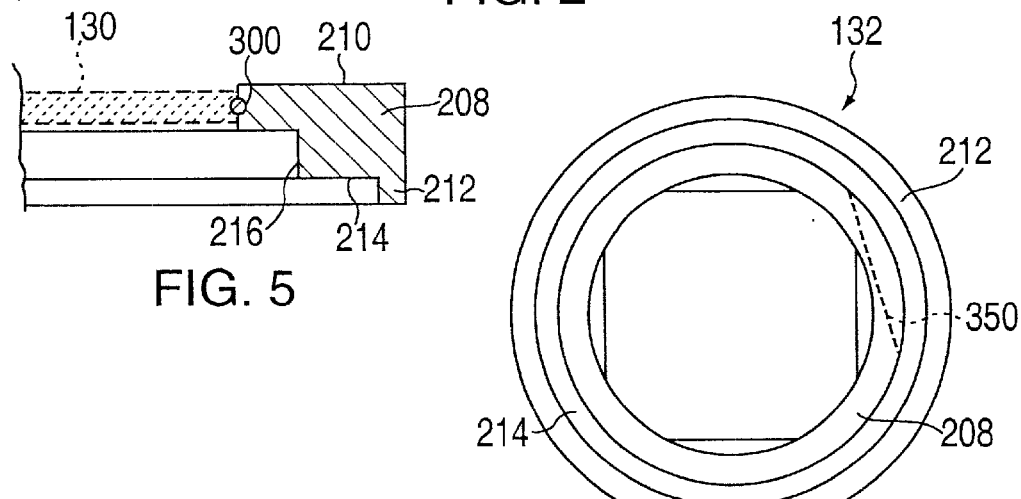
FIG. 5
FIG. 3
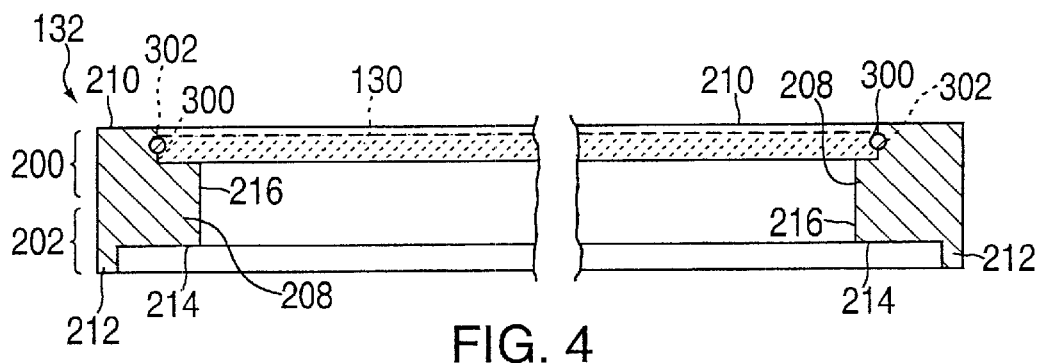
FIG. 4

RETICLE ADAPTER FOR A REACTIVE ION ETCH SYSTEM

This application is a divisional of U.S. patent application Ser. No. 09/238,205, filed Jan. 27, 1999, now U.S. Pat. No. 6,251,217, which is hereby incorporated by reference in its entirety.

BACKGROUND OF THE DISCLOSURE

1. Field of the Invention

The invention generally relates to reactive ion etching systems for photomask fabrication upon a reticle and, more particularly, to a reticle adapter that facilitates dry etching a photomask using a conventional reactive ion etch chamber.

2. Background of the Invention

Semiconductor lithography is accomplished using a reticle comprising a relatively thick substrate typically fabricated of quartz, having a photomask fabricated of chrome patterned upon the surface of the substrate. A reticle is generally 5 inches by 5 inches, 6 inches by 6 inches or 9 inches by 9 inches. To fabricate the photomask pattern, a uniform submicron (e.g., 0.1 to 1.0 micron) thick layer of chrome has a photoresist layer applied thereto. The photoresist is then patterned using conventional laser or electron beam patterning equipment. The chrome layer is then etched using a wet etch process to remove material not protected by the photoresist. The isotropic characteristic of a wet etch causes an undercut phenomenon to occur below the photoresist material such that the chrome lines that are patterned upon the reticle are not uniformly spaced nor do they have vertical side walls. Such undercut on photomask patterns that will be used to produce sub 0.25 µm devices can result in erroneous lithography.

As semiconductor devices shrink in size, the on-mask chrome structures must also experience a corresponding reduction in size. The use of optical proximity correction (OPC) structures that are generally needed to minimize lines for shortening and corner rounding have necessitated significantly smaller features to be etched into the chrome. With the need for OPC structures and the small line widths of the chrome features, the use of wet etching to form photomasks has become undesirable. Additionally, the environmental concerns for disposal of the by-products of a wet etch process have also led to wet etch photomask processing's undesirability.

Plasma etch processing (also known as dry etch processing) provides an alternative to wet etching and can provide superior photomask fabrication results. Dry etch of photomasks for lithography reticles has been shown to improve resolution, critical dimensions and critical dimension linearity as well as take advantage of the anisotropic etch characteristics such that very little or no undercutting is experienced. Although reactive ion etching to form photomasks has been shown to have superior results compared to wet etch, the industry has been slow to design new and costly dry etch chambers and equipment to facilitate photomask generation. Conversion of traditional wafer etching equipment that is intended to handle 8 inch (200 mm) circular wafers into a system for handling 5, 6 or 9 inch square reticles typically requires replacement of the wafer support pedestal. This is generally costly and complicated.

Therefore, there is a need in the art for an adapter that can be used to convert a conventional reactive ion etch chamber into a chamber capable of dry etching a photomask without substantial cost or complicated equipment.

SUMMARY OF THE INVENTION

The disadvantages associated with the prior art are overcome by the invention of a reticle adapter that is capable of supporting a square reticle in a conventional reactive ion etch (RIE) chamber that is designed for etching circular silicon wafers. In short, the adapter converts the circular pedestal into a square photomask reticle support. The adapter is fabricated from a non-reactive material such as polyimide, ceramic or quartz.

More specifically, the adapter has a base portion that is milled to conformally cover the entire upper portion of a wafer pedestal such that plasma cannot contact the pedestal. The adapter contains a base portion that has a circular plan form and an inner surface that follows the contours of the top of the pedestal. The reticle rests in the upper portion of the adapter, spaced apart from the pedestal upper surface. As such, the reticle backside will not contact the pedestal surface and become contaminated or scratched. The reticle backside is only contacted by the adapter at its four corners or its edges such that the central portion of the reticle through which light passes during lithography is not contacted by the adapter nor any part of the reactive ion etch chamber.

The adapter is designed to fit over the electrostatic chuck of a reactive ion etch chamber such as the decoupled plasma source (DPS) metal etch chamber fabricated by Applied Materials, Inc. of Santa Clara, Calif. Once supported in the chamber a plasma is generated above the reticle such that the photomask is etched in approximately 2 minutes to remove the excess chrome that is not protected by photoresist material and leave a photolithography pattern behind.

The reticle adapter can be also outfitted with mechanical restraining elements to hold the reticle within the adapter such that once the reticle is loaded into the adapter it never needs to be contacted by either robotics or human hands. As such, the reticle can be easily carried from place to place and chamber to chamber as processing is accomplished. One embodiment of a mechanical retainer consists of four either spring loaded or threaded screws that are screwed into the sides of the adapter and can be tightened to apply force to the reticle such that the reticle will not fall out of the adapter once the screws are tightened. Consequently, the invention is not only an adapter, but a reticle carrier as well.

BRIEF DESCRIPTION OF THE DRAWINGS

The teachings of the present invention can be readily understood by considering the following detailed description in conjunction with the accompanying drawings, in which:

FIG. 2 depicts a top view of the present invention;

FIG. 3 depicts a bottom view of the present invention;

FIG. 4 depicts a cross-sectional view taken along lines 4—4 of FIG. 2;

FIG. 5 depicts a cross-sectional view taken along lines 5—5 of FIG. 2;

To facilitate understanding, identical reference numerals have been used, where possible, to designate identical elements that are common to the figures.

DETAILED DESCRIPTION

Figure 1:
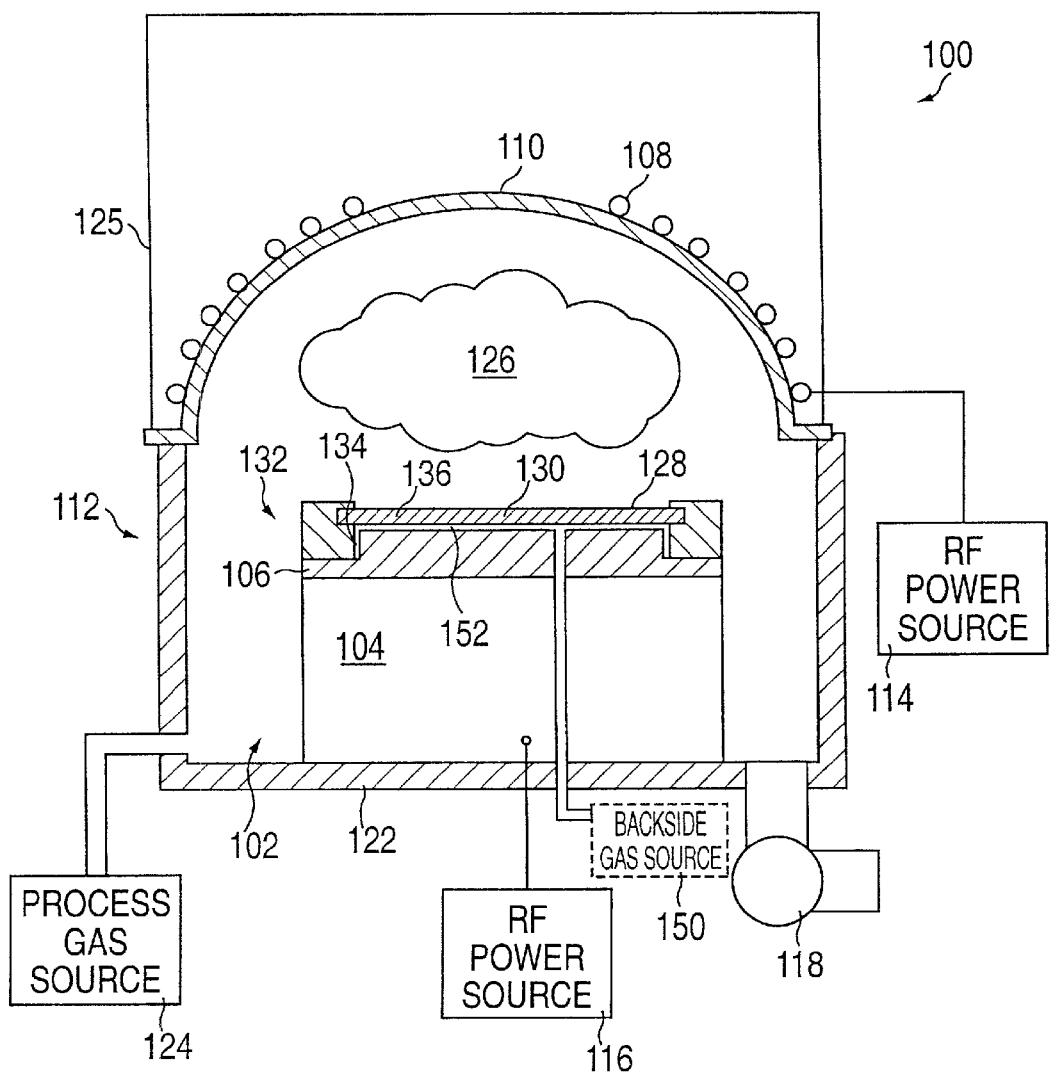
FIG. 1 depicts a schematic view of a RIE chamber containing the reticle adapter of the present invention.

FIG. 1 depicts a conventional reactive ion etch (RIE) reactor 100 such as the decoupled plasma source (DPS)

metal etch chamber that is manufactured by Applied Material, Inc. of Santa Clara, Calif. Such a chamber is an example of one of many types of reactive ion etch chambers that can be used with the present invention for etching photomasks upon reticles for photolithography applications. The DPS metal etch chamber, in particular, is well suited for etching metals such as chrome that are used to form photomasks on reticles.

The DPS chamber 100 includes a vacuum chamber 112, a first RF power source 114, a second RF power source 116, a vacuum pump 118, and a top housing 125. The vacuum chamber 112 is defined by a ceramic or quartz dome 110, a cylindrical side wall 120 and a bottom 122. The top housing 125 generally encloses dome and wafer heating and cooling apparatus (not shown). The pedestal 102 generally has a biased cathode 104 and an electrostatic chuck 106 for retaining wafers in the chamber 100. The DPS chamber 100 also features a powered antenna 108 located above the wafer on the outside of a quartz dome 110. The vacuum chamber 112 is coupled to the vacuum pump 118 to draw a vacuum inside the chamber. Once a vacuum is established, process gases (e.g., $Cl_2$ and $O_2$) are pumped into the chamber from process gas source 124 and power supplied to both the cathode 104 and the antenna 108. A plasma 126 is formed in the chamber to etch a semiconductor wafer, or in this case, a photomask 128 of a reticle 130.

The pedestal 102 is designed for retaining a circular (e.g., 8 inch (200 mm)) semiconductor wafer. To enable a square (e.g., 6 inch by 6 inch) to be etched in the DPS chamber, an adapter 132 must adapt the circular wafer support surface 134 into a square reticle support surface 136. Additionally, the adapter 132 must cover the entire surface of the electrostatic chuck 106 that is not covered by the reticle 130 such that the plasma 126 does not contact the chuck surface 134 and produce contaminants in the chamber 112 as well as destroy the electrostatic chuck 106. In one embodiment of the invention, the adapter 132 replaces the standard collar that generally surrounds the wafer and protects the pedestal from being etched or, in an alternative embodiment of the invention, the adapter mates with a modified collar (not shown) to accomplish the same purpose, i.e., protect the pedestal from the plasma. Generally speaking, the adapter 132 covers all areas of the electrostatic chuck that are not otherwise covered by the reticle or existing chamber components.

FIGS. 2, 3 and 4 respectively depict a top, bottom and cross-sectional views of the inventive reticle adapter 132. To best understand the invention the reader should refer to all these drawings simultaneously while reading the following disclosure.

The adapter 132 is generally formed from a single piece of etch resistant, high temperature resistant material such as polyimide ceramic or quartz. Such a material that withstands high temperature is manufactured by DuPont de Nemours, Inc. under the registered trademark VESPEL. A solid block or a laminate of this material can be milled into the shape of the adapter 132. Using a laminate of material layers provides certain manufacturability benefits that can be used to encapsulate a reticle retainer into the adapter, as described below with respect to FIGS. 6 and 7. In FIGS. 2, 3 and 4, the upper portion 200 of the adapter 132 contains a substantially square opening 204 that is sized to the outer shape of a reticle (shown in phantom as 130 in FIG. 4), i.e., a 6 inch by 6 inch square with rounded corners 206. Each corner 206 of the opening 204 contains a support region 208 in each corner 206 that extends into the opening 204 such that the reticle 130 rests upon the support region 208 and not fall completely through the adapter 132. The upper surface 210 of the adapter 132 extends a slight distance above the reticle 130 when the reticle 130 is placed inside the opening 204. The lower portion 202 of the adapter 132 is milled to have a form that conformally fits over the top of the pedestal in the RIE chamber or, alternatively, mates to a separate modified collar.

To facilitate reticle alignment, a modified collar and adapter may include an alignment member or key such as a protrusion on the collar and a detent to accept the protrusion on the adapter. Alternatively, as shown in phantom in FIG. 3, the lower circular opening defined by vertical wall 216 is provided with a flat 350 that matches the flat on the semiconductor wafer electrostatic chuck. As such, the adapter 132 can be used for orienting the reticle within the chamber such that the flat of the chuck (generally used to orient wafers) matches the flat on the adapter and the reticle will always be properly aligned in the chamber.

To fit the DPS chamber, for example, the adapter 132 has an overhanging vertical lip 212 (or alignment key) that extends over the outer sidewall of the pedestal, a horizontal extension 214 that rests upon the flange of the electrostatic chuck, a vertical portion 216 that extends along the vertical edge of the electrostatic chuck, and a support region 208 upon which the reticle 130 rests. The height of the support region 208 above the chuck surface insures that the reticle 130 when resting in the adapter 132 does not contact the surface of the electrostatic chuck thus reducing the contaminants that may be transmitted from the electrostatic chuck surface to the backside of the reticle. The reticle and surface are spaced apart by about 1 mil. Such contaminants would be very hard to remove from the reticle and, if not removed, would interfere with the photolithography process.

The reticle adapter 132 can be used, as shown, as a reticle carrier such that the reticle may be carried from location to location by holding the adapter 132 and not the reticle itself. As such, fingerprints and other residue from a person's hands will not contact the reticle. Furthermore, by using the adapter 132 as a reticle carrier, the reticle carrier can be rested on a flat surface and it maintains a space between the reticle and the surface. Consequently, contaminant particles will not be "picked up" by the reticle and the reticle will not be scratched by contact with other surfaces.

To facilitate easy loading and removal of the reticle 130 to/from the adapter 132 without touching the glass surfaces of the reticle, the adapter 132 may be provided with a plurality access features or elements. In the embodiment shown, such features are implemented as access indentations 275. Although only two indentations 275 are shown, the invention may have any number of access indentations 275 on one or more of the sides of opening 204. The indentations 275 allow fingertip access to the sidewalls of the reticle 130 such that lifting the reticle from the adapter 132 is simplified. Similar access indentations could be used to provide a robot gripping mechanism with access to the sidewalls of the reticle 130.

Figure 6:
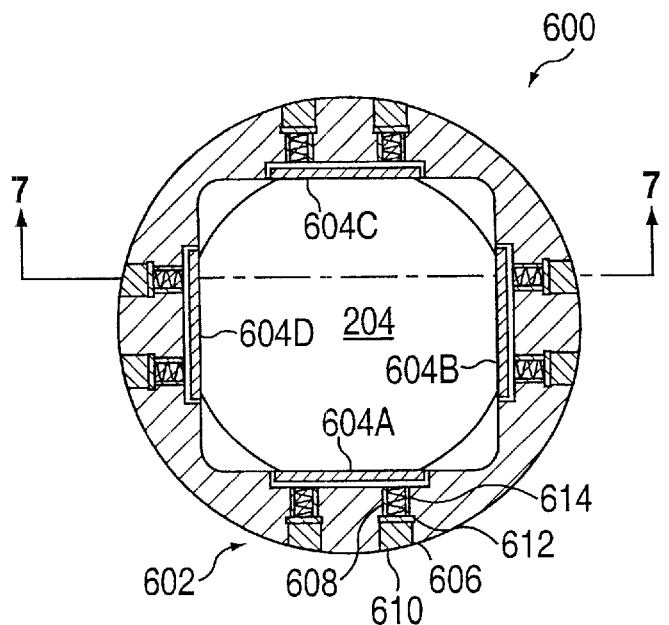
FIG. 6 depicts a cross-sectional view of the present invention having a reticle retaining mechanism.
Figure 7:
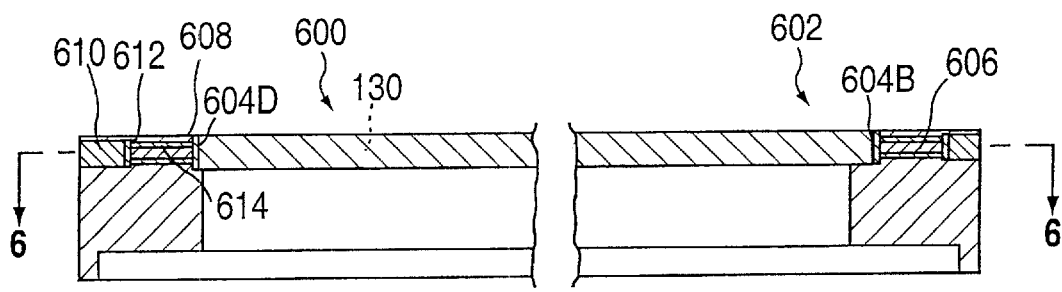
FIG. 7 depicts a cross-sectional view of FIG. 6 taken along line 7—7.

To improve the adapter's function as a reticle carrier and insure that the reticle will not fall out of the adapter and break, a mechanical retaining apparatus may be provided to insure that the reticle remains within the adapter. FIGS. 6 and 7 respectively depict top and bottom cross sectional views of one embodiment of a reticle carrier 600 having a reticle retainer 602. The reticle retainer 602 may be one of many different devices that applies a force to the reticle to retain it in the adapter.

The illustrative embodiment of FIGS. 6 and 7 uses a set of four retainer plates 604A–604D positioned about the perimeter of the opening 204 (i.e., one plate in each side). Each plate 604 is mounted to a pair of retaining pins 606. The pins 606 slideably engage a pair of bores 608. The head 610 of each pin 606 is retained by a barrier portion 612 located in each bore 608. A coil spring 614 circumscribes each pin 606 and has one end of the spring 614 abutting a backside of the plate 604 and the second end of the spring 614 abutting the barrier portion 612. The pin heads 610 slideably engage an outer portion of bores 608. The bores 608 and barrier portion 612 may be fabricated with to components where the bore is drilled and an annular barrier portion 612 then affixed into each of the bores 608, or, alternatively, the bores 608 and their respective barrier portions 612 are integrally formed into the material of the carrier as the carrier is fabricated from a laminate of material. The pins 606 can then be embedded into the carrier 600 during fabrication.

The springs 614 bias the plates 604 into contact with the reticle 130. The plates 604 rest against the sidewalls 620 of the reticle 130 such that the plates 604 apply a force to all sides of the reticle 130 that will retain the reticle within the carrier 600.

The reticle may be removed from the carrier by disengaging the plates 604 from the sidewalls of the reticle, i.e., by compressing the springs and lifting the reticle from the carrier 600. While the reticle is within the carrier, the reticle may be moved from place to place, whether by robotic means or by human hands, without the robot or human touching the reticle and placing contaminants thereupon. Also, once the reticle is affixed to the carrier, a plurality of carriers can be stacked in a cassette much like wafers are transported in a cassette.

Alternatively, as depicted in phantom in FIG. 5, the reticle 130 may be sealed within the adapter 132 by an o-ring 300 that generally circumscribes the square opening 204. The o-ring is fabricated from a conventional high-temperature resilient material such as Viton or Chem-Res. The o-ring 300 lies within a trough 302. When a reticle 130 is inserted into the opening 204, the o-ring is compressed and applies pressure or force upon the outside perimeter of the reticle 130 and thereby forms another embodiment of a reticle retainer that holds the reticle 130 in the adapter 132. Using an o-ring 300 to seal the reticle 130 to the adapter 132 also enables "backside gas" to be applied between the reticle and the pedestal surface such that heat will conduct from the reticle to the pedestal. Generally, the backside gas is an inert gas such as either helium or argon. The backside gas is optionally supplied by gas source 150 (shown in phantom in FIG. 1) through gas portals to the surface of the electrostatic chuck 106. To promote heat transfer from the reticle 130 to the chuck 106, the gas fills the space 152 between the back of the reticle 130 and the surface of the chuck 106.

To sufficiently transfer heat from the reticle to the chuck, a substantial gas pressure may exist beneath the adapter. This gas pressure may be great enough to lift the adapter from the chuck. To compensate for the gas pressure, the adapter could be weighted with heavy material, e.g., lead, encapsulated in the adapter. Alternatively, a clamp ring can be fitted to the periphery of the adapter to retain the adapter upon the chuck when substantial backside gas pressure is applied between the chuck and the reticle. Such a clamp ring would be similar to that used to retain a wafer upon a chuck in a M×P chamber of a P5000 platform, as manufactured by Applied Materials, Inc. of Santa Clara, Calif.

Although various embodiments which incorporate the teachings of the present invention have been shown and described in detail herein, those skilled in the art can readily devise many other varied embodiments that still incorporate these teachings.

What is claimed is:

1. A reactive ion etch chamber comprising:
   a pedestal having a support surface; and
   an adapter having a first side that covers said support surface of said pedestal and a second side to support a photolithography reticle within the chamber.

2. The reactive ion etch chamber of claim 1 wherein said first side and said second side are separated by a support region that supports said reticle in a spaced apart relation with respect to said support surface to form a space therebetween.

3. The reactive ion etch chamber of claim 2 wherein said second side further comprises a seal between said reticle and said second side.

4. The reactive ion etch chamber of claim 3 wherein said seal retains a gas within said space between said reticle and said support surface.

5. The reactive ion etch chamber of claim 4 wherein said seal is an O-ring that is located in a channel that circumscribes an opening within which the reticle resides.

6. A reactive ion etch chamber, comprising:
   a pedestal having a support surface; and
   an adapter having a first portion on a first side that matches the size and shape of the support surface of the pedestal and a second portion on a second side that is adapted to support a photolithography reticle.

7. The reactive ion etch chamber of claim 6, wherein the first portion defines a first opening.

8. The reactive ion etch chamber of claim 7, wherein the first opening is adapted to rest upon the support surface of the pedestal.

9. The reactive ion etch chamber of claim 8, wherein the first opening is adapted to rest upon the support surface of the pedestal by being milled to conformally fit over the support surface of the pedestal.

10. The reactive ion etch chamber of claim 8, wherein the first opening is adapted to rest upon the support surface of the pedestal by mating to a modified collar.

11. The reactive ion etch chamber of claim 7, wherein the adapter is aligned with the pedestal.

12. The reactive ion etch chamber of claim 11, wherein the adapter is aligned with the pedestal by a flat in the adapter which matches a flat on the pedestal.

13. The reactive ion etch chamber of claim 11, wherein the adapter is aligned with the pedestal by a detent in the adapter which mates with an alignment member in a modified collar.

14. The reactive ion etch chamber of claim 7, wherein the first opening is adapted to rest upon the support surface of the pedestal and the adapter is aligned with the pedestal.

15. The reactive ion etch chamber of claim 6, wherein the second portion defines a second opening.

16. The reactive ion etch chamber of claim 15, further comprising a reticle retainer located within the second opening.

17. The reactive ion etch chamber of claim 16, wherein the reticle retainer comprises:
   at least one plate, having a longitudinal axis parallel with an edge of the second opening, where said at least one plate extends from the peripheral edge of the second opening into the second opening.

18. The reactive ion etch chamber of claim 17, wherein the reticle retainer further comprises at least one resilient member for biasing the at least one plate into the second opening.

19. The reactive ion etch chamber of claim 16, wherein the reticle retainer comprises:
four plates, where each plate has a longitudinal axis aligned with an edge of the second opening; and
at least one spring for each plate, disposed between each plate and an edge of the second opening to bias each of the four plates into the second opening.

20. The reactive ion etch chamber of claim 16, wherein the reticle retainer further comprises a seal between the reticle and the second side, whereby a gas is retained within the space between the reticle and the support surface.

21. The reactive ion etch chamber of claim 20, wherein the seal is an O-ring that is located in a channel circumscribing the second opening.

22. The reactive ion etch chamber of claim 20, wherein the adapter further comprises a securing element to maintain contact between the first side of the adapter and the support surface of the pedestal.

23. The reactive ion etch chamber of claim 22, wherein the securing element is either a clamp or a weight.

24. The reactive ion etch chamber of claim 15, further comprising a plurality of reticle support members located within the second opening.

25. The reactive ion etch chamber of claim 24, wherein the second opening is substantially square having four corners and the reticle support members are located in each corner.

26. The reactive ion etch chamber of claim 6, wherein the first side and the second side of the adapter are separated by a support region which supports the reticle in a spaced apart relation with respect to the support surface of the pedestal to form a space therebetween.

27. A reactive ion etch chamber, comprising:
a pedestal having a support surface; and
adapting means for supporting a photolithography reticle on the support surface of the pedestal.

28. The reactive ion etch chamber of claim 27, wherein the adapting means further comprises a first portion on a first side that matches the size and shape of the support surface of the pedestal and a second portion on a second side that is adapted to support a photolithography reticle.

29. The reactive ion etch chamber of claim 28, wherein the first side and second side are separated by a support region that maintains the reticle in a spaced apart relation with respect to the support surface of the pedestal to form a space therebetween.

30. The reactive ion etch chamber of claim 28, wherein the first portion defines a first opening.

31. The reactive ion etch chamber of claim 30, wherein the first opening is adapted to rest upon the pedestal.

32. The reactive ion etch chamber of claim 31, wherein the first opening is adapted to rest upon the pedestal by being milled to conformally fit over the support surface of the pedestal.

33. The reactive ion etch chamber of claim 31, wherein the first opening is adapted to rest upon the pedestal by mating to a modified collar.

34. The reactive ion etch chamber of claim 28, wherein the adapting means further comprises means for aligning the reticle with the pedestal.

35. The reactive ion etch chamber of claim 34, wherein the aligning is a flat which matches a flat the pedestal.

36. The reactive ion etch chamber of claim 34, wherein the aligning means is a detent on the adapting means which mates with an alignment member on a modified collar which is attached to the support surface of the pedestal.

37. The reactive ion etch chamber of claim 28, wherein the adapting means further comprises for aligning the reticle with the pedestal and is adapted to rest upon the support surface of the pedestal.

38. The reactive ion etch chamber of claim 28, wherein the second portion defines a second opening.

39. The reactive ion etch chamber of claim 38, wherein the adapting means further comprises a plurality of reticle support members located within the second opening.

40. The reactive ion etch chamber of claim 39, wherein the second opening is substantially square having four corners and the reticle support members are located in each corner.

41. The reactive ion etch chamber of claim 38, wherein the adapting means further comprises means for retaining the reticle located within the second opening.

42. The reactive ion etch chamber of claim 41, wherein the retaining means further comprises at least one plate, having a longitudinal axis parallel with an edge of the second opening, where said at least one plate extends from the peripheral edge of the second opening into the second opening.

43. The reactive ion etch chamber of claim 42, wherein the retaining means further comprises at least one resilient member for biasing the at least one plate into the second opening.

44. The reactive ion etch chamber of claim 41, wherein the retaining means further comprises four plates, where each plate has a longitudinal axis aligned with an edge of the second opening, and, at least one spring for each plate, disposed between each plate and an edge of the second opening to bias each of the four plates into the second opening.

45. The reactive ion etch chamber of claim 41, wherein the retaining means further comprises means for sealing the gap between the reticle and the adapting means, whereby a gas may be retained within the space between the reticle and the support surface.

46. The reactive ion etch chamber of claim 45, wherein the retaining means and the sealing means is an O-ring that is located in a channel circumscribing the second opening.

47. The reactive ion etch chamber of claim 45, wherein the adapting means further comprises means for securing the adapting means to the pedestal.

48. The reactive ion etch chamber of claim 47, wherein the securing means is either a weight or a clamp.

* * * * *